(12) United States Patent
Abidin et al.

(10) Patent No.: US 6,831,521 B1
(45) Date of Patent: Dec. 14, 2004

(54) METHOD AND APPARATUS FOR DETECTING INTERRUPTION OF AN INPUT SIGNAL WITH CANCELLATION OF OFFSET LEVEL

(75) Inventors: Cindra W. Abidin, Los Angeles, CA (US); Georgios Asmanis, North Hollywood, CA (US); Yihai Xiang, Las Flores, CA (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 10/459,147

(22) Filed: Jun. 11, 2003

(51) Int. Cl.[7] .............................. H03F 3/08; H03G 3/10; H03G 3/20
(52) U.S. Cl. ...................... 330/308; 330/279; 330/136
(58) Field of Search ................................ 330/308, 279, 330/136

(56) References Cited

U.S. PATENT DOCUMENTS

| | | | | |
|---|---|---|---|---|
| 5,430,765 A | * | 7/1995 | Nagahori | ...................... 375/318 |
| 6,232,842 B1 | * | 5/2001 | Asano | ......................... 330/308 |
| 6,292,058 B1 | * | 9/2001 | Ide et al. | ..................... 330/279 |
| 6,377,082 B1 | * | 4/2002 | Loinaz et al. | ................. 327/20 |

* cited by examiner

*Primary Examiner*—Patricia Nguyen
(74) *Attorney, Agent, or Firm*—Buckley, Maschoff & Talwalker LLC

(57) ABSTRACT

An input branch of a loss-of-signal (LOS) detector is coupled to a first input of a comparator. A threshold branch of the LOS detector is coupled to a second input of the comparator. An operational amplifier is connected between the input branch and the threshold branch to couple an offset level from the input branch to the threshold branch. The offset level is then cancelled at the comparator.

26 Claims, 7 Drawing Sheets

METHOD AND APPARATUS FOR DETECTING INTERRUPTION OF AN INPUT SIGNAL WITH CANCELLATION OF OFFSET LEVEL

BACKGROUND

Devices such as optical transceivers, limiting amplifiers and transimpedance amplifiers often include a circuit arrangement to detect interruption of an input signal. Such a circuit arrangement is referred to as a "loss-of-signal" (LOS) detector. One difficulty that may be encountered in an LOS detector is a mismatch between input and reference branches of the LOS detector. If off-chip compensation is employed, via a variable resistor for example, the mismatch problem can be avoided, but at considerable cost in terms of labor and additional hardware.

DETAILED DESCRIPTION

Figure 1:
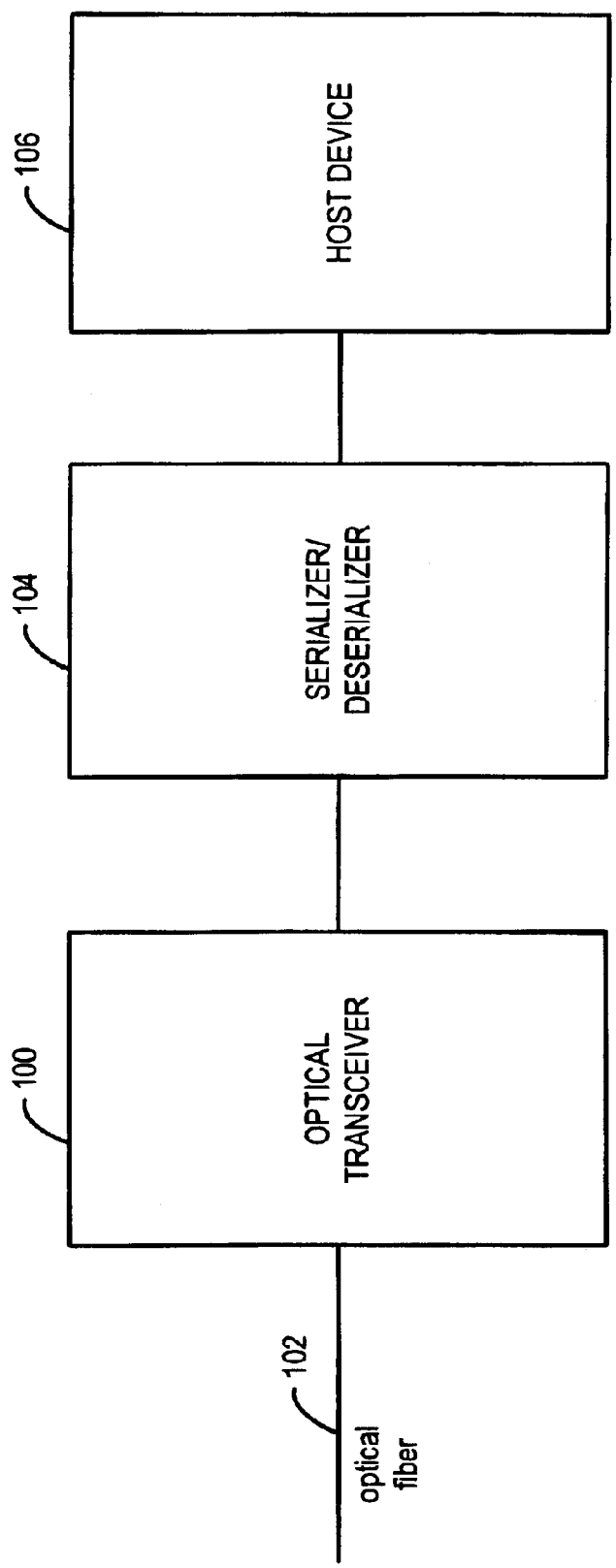
FIG. 1 is a block diagram of a data processing or storage apparatus according to some embodiments.

FIG. 1 is a block diagram of a data processing or storage apparatus according to some embodiments. The apparatus of FIG. 1 includes an optical transceiver 100 coupled to an optical communication fiber 102. A serializer/deserializer 104 couples the optical transceiver 100 to a host device 106. The host device 106 may be, for example, a processor, a computer such as a server, or a storage device such as a disk drive. The host device 106 and the serializer/deserializer 104 may both be conventional devices.

Figure 2:
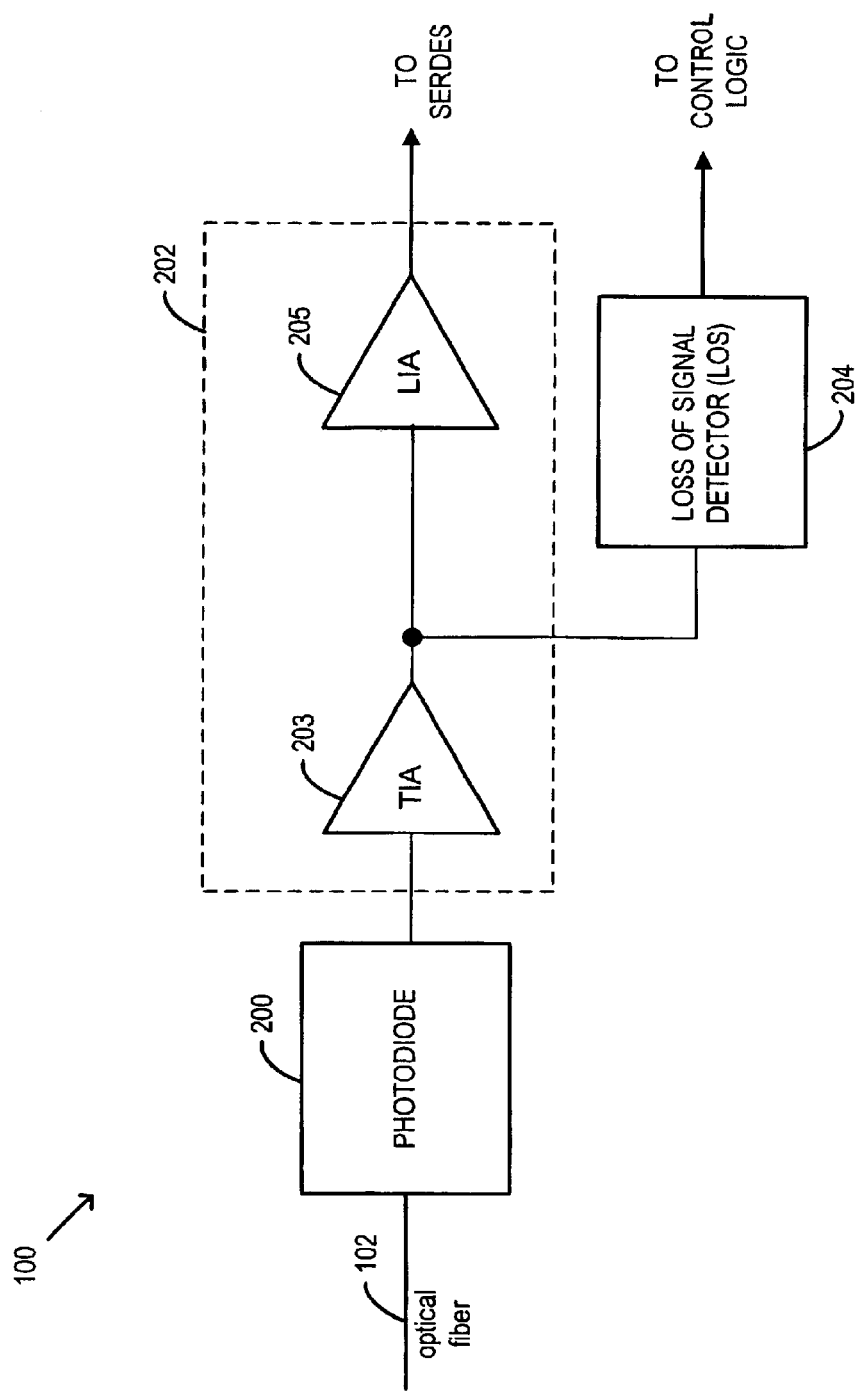
FIG. 2 is a partial block diagram representation of an optical transceiver that is part of the apparatus of FIG. 1.

FIG. 2 is a partial block diagram of the optical transceiver 100 shown in FIG. 1.

The optical transceiver 100 includes a photodiode 200 coupled to the optical fiber 102 to receive an optical input signal and to convert the optical input signal to an electrical input signal. The optical transceiver 100 also includes a receive amplifier 202 that is coupled to the photodiode 200 to receive the electrical input signal and to amplify the electrical input signal. The amplified input signal is provided from the receive amplifier 202 to the serializer/deserializer 104 (FIG. 1) which converts the amplified input signal to parallel form. The resulting parallel input signal is provided to the host device 106. Hence the host device 106 is coupled to the receive amplifier 202 to receive input signals via the receive amplifier 202 and the serializer/deserializer 104.

The photodiode 200 and the receive amplifier 202 may be provided in accordance with conventional practices. The receive amplifier 202 may include a conventional transimpedance amplifier 203 coupled to the photodiode 200 to receive the electrical input signal, and a conventional limiting amplifier 205 coupled to the output of the transimpedance amplifier 203. The limiting amplifier 205 provides the amplified input signal to the serializer/deserializer 104 (FIG. 1).

Also included in the optical transceiver 100 is an LOS detector 204 provided according to some embodiments. The LOS detector 204 is coupled to the photodiode 200 to receive the electrical input signal via the transimpedance amplifier 203. As will be seen, the LOS detector 204 is arranged to detect when the input signal is interrupted. When this occurs, the LOS detector 204 outputs a suitable signal to control logic (which is not shown) so that the control logic can take suitable steps such as initiating system reinitialization and/or debugging procedures.

According to alternative arrangements of the optical transceiver 100, the LOS detector 204, as described below, may be modified so as to be suitable for receiving the current signal output from the photodiode 200 and may be coupled directly to the photodiode 200. According to other alternative arrangements, the LOS detector 204 may be coupled to receive an intermediate signal from the transimpedance amplifier 203, if the transimpedance amplifier 203 has more than one gain stage.

To simplify the drawing, certain elements of the optical transceiver, including those associated with a signal transmission (outbound) path, are omitted. These elements may be provided in accordance with conventional practices.

Figure 3:
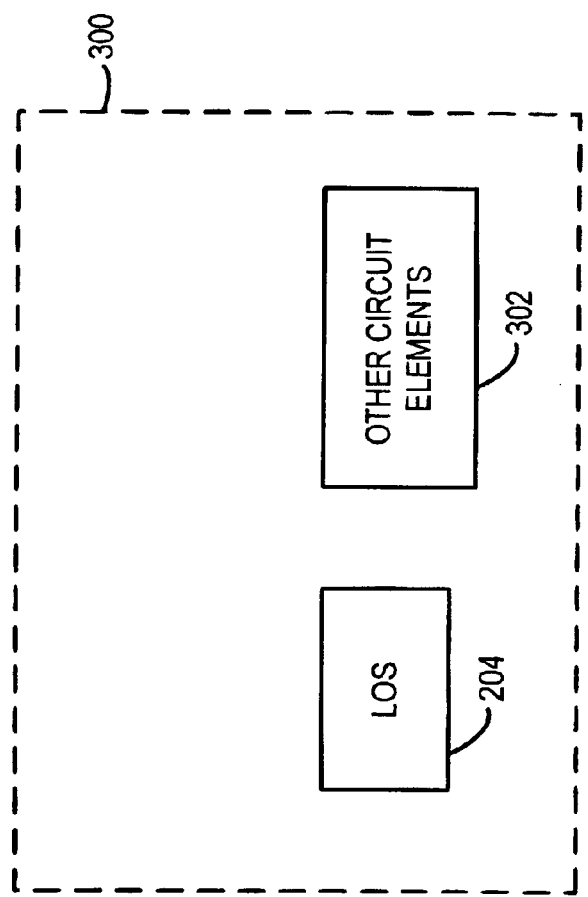
FIG. 3 is a schematic representation of a semiconductor die on which at least a portion of the optical transceiver is formed.

FIG. 3 is a schematic representation of a semiconductor die 300 on which at least a portion of the optical transceiver 100 (FIGS. 2 and 3) is formed. The circuit elements formed on the semiconductor die 300 include the LOS detector 204 and other elements 302 of the optical transceiver 100.

Figure 4:
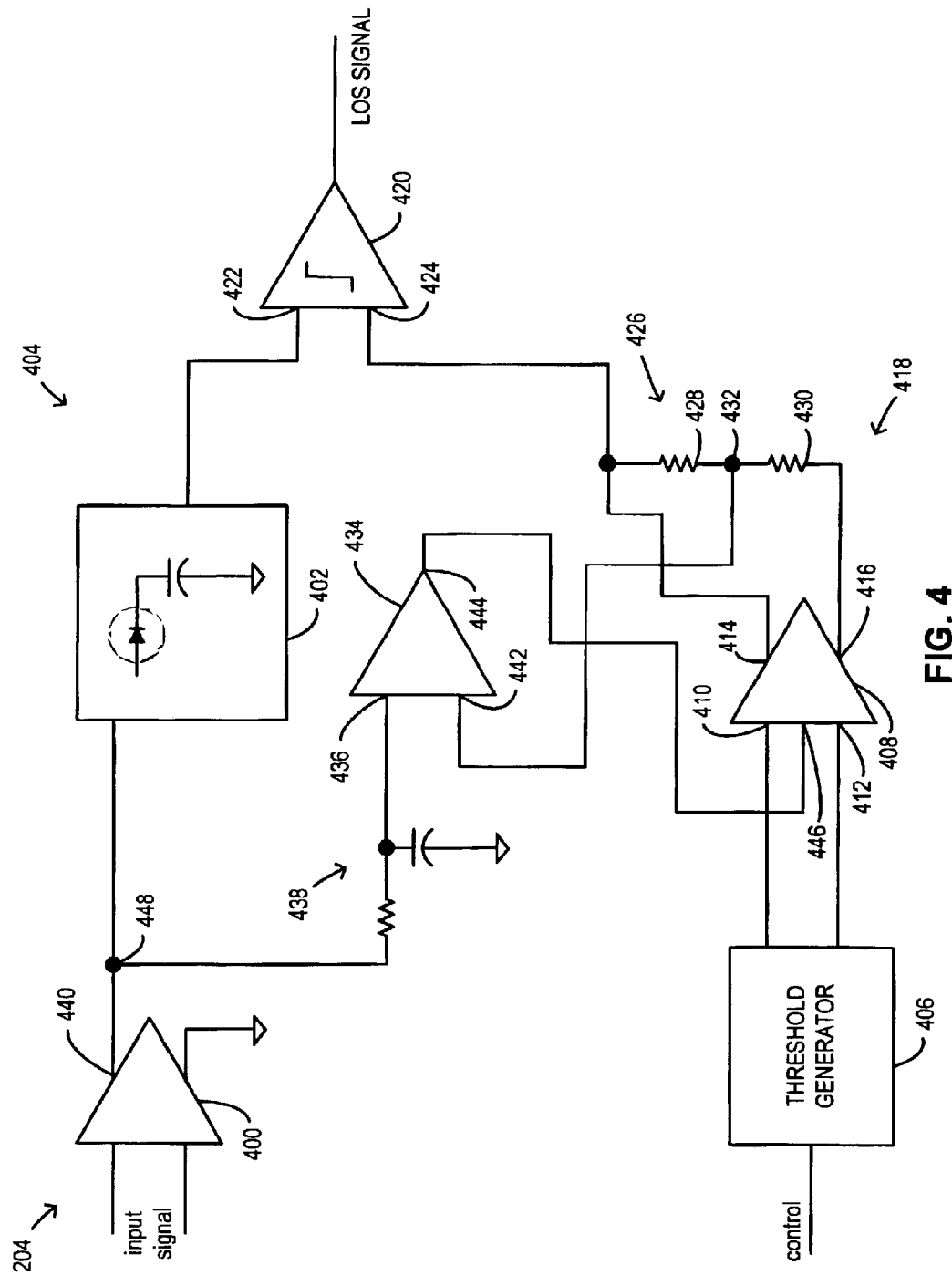
FIG. 4 is a schematic circuit diagram of an LOS detector according to some embodiments.

FIG. 4 is a schematic circuit diagram that illustrates an LOS detector 204 provided according to some embodiments.

The LOS detector 204 includes an input amplifier 400 coupled to the photodiode 200 (FIG. 2) to receive via the receive amplifier 202 the electrical input signal provided by the photodiode. The input amplifier 400 outputs an amplified input signal. In some embodiments, the input amplifier 400 may have the largest possible gain for which there is no clipping of the signal and linearity is maintained.

Also included in the LOS detector 204 is a peak detector 402 that is coupled to the input amplifier 500 to receive the amplified input signal. As will be seen, the peak detector outputs a peak level signal that represents a peak level of the amplified input signal. The input amplifier 400, the peak detector 402, and related interconnections constitute an input branch 404 of the LOS detector 204.

The LOS detector 204 also includes a programmable threshold generator 406 and a threshold amplifier 408 coupled via a pair of inputs 410, 412 to receive a differential threshold signal from the threshold generator 406. The threshold amplifier 408 outputs an amplified differential threshold signal via outputs 414, 416. In some embodiments, the threshold amplifier 408 is formed on the same semiconductor die 300 (FIG. 3) as the input amplifier 400 and is configured to substantially match a gain provided by the input amplifier 400. Also, the gain of the threshold amplifier 408 may track the gain of the input amplifier 400 over process, supply voltage and temperature (PVT) variations.

The threshold amplifier 408 may be designed to have a low input referred offset. Offset minimization by layout such as cross-coupled layout techniques may be employed, for example.

The threshold generator 406 and the threshold amplifier 408, together with related interconnections, constitute a threshold branch 418 of the LOS detector 204.

The LOS detector 204 also includes a comparator 420 coupled to the peak detector 402 (via a first input 422 of the comparator 420) and to the threshold amplifier 408 (via the output 414 of the threshold amplifier 408 and via a second input 424 of the comparator 420). The comparator 420 compares the peak level signal output from the peak detector 402 to the amplified threshold signal output from the threshold amplifier 408. On the basis of the comparison, the comparator 420 may output an LOS signal. For example, the comparator 420 may output the LOS signal in the event that the peak level signal is less than the amplified threshold signal.

The LOS detector 204 also includes a voltage divider 426 connected between the outputs 414, 416 of the threshold amplifier 408. The voltage divider 426 is formed of resistors 428, 430 and has a center node 432 between the resistors 428, 430. The divider 426 may be designed to extract the common mode voltage of the outputs 414, 416 of the threshold amplifier 408. The resistors 428, 430 may be much larger than the DC output impedance of the threshold amplifier 408.

Also included in the LOS detector 204 is an operational amplifier 434 to provide coupling between the input branch 404 and the threshold branch 418 in order to allow for minimizing of mismatches due to offsets. The operational amplifier 434 includes an input 436 coupled via an RC filter 438 to an output 440 of the input amplifier 400. The operational amplifier 434 also has another input 442 coupled to the center node 432 of the voltage divider 426. (It will also be recognized that the input 442 of the operational amplifier 434 is coupled to the output 414 of the threshold amplifier 408 via the resistor 428.) The operational amplifier 434 also has an output 444 coupled to a third input 446 of the threshold amplifier 408.

Figure 5:
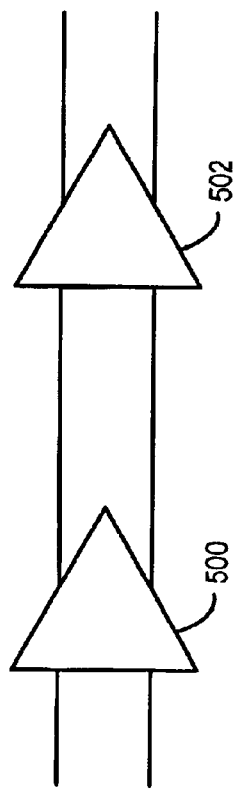
FIG. 5 is a schematic circuit diagram that illustrates a two-stage construction of an input amplifier that is part of the LOS detector of FIG. 4.

FIG. 5 is a high-level schematic illustration of the input amplifier 400. As seen from FIG. 5, the input amplifier 400 may be formed in two cascaded amplifier stages, namely an input stage 500 and an output stage 502.

Figure 6:
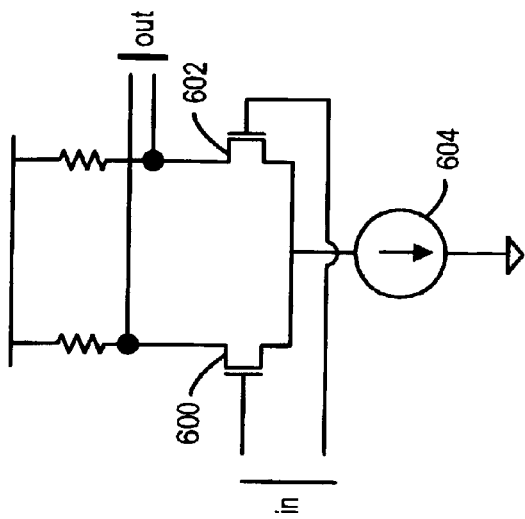
FIG. 6 is a schematic circuit diagram that illustrates a typical one of the amplifier stages of FIG. 5.

FIG. 6 is a schematic circuit diagram that illustrates the construction in MOSFET circuitry, according to some embodiments, of either or both of the amplifier stages 500, 502 shown in FIG. 5. The amplifier stages 500 and/or 502 may be formed as a differential pair with field effect transistors 600, 602 biased by a current source 604.

Figure 7:
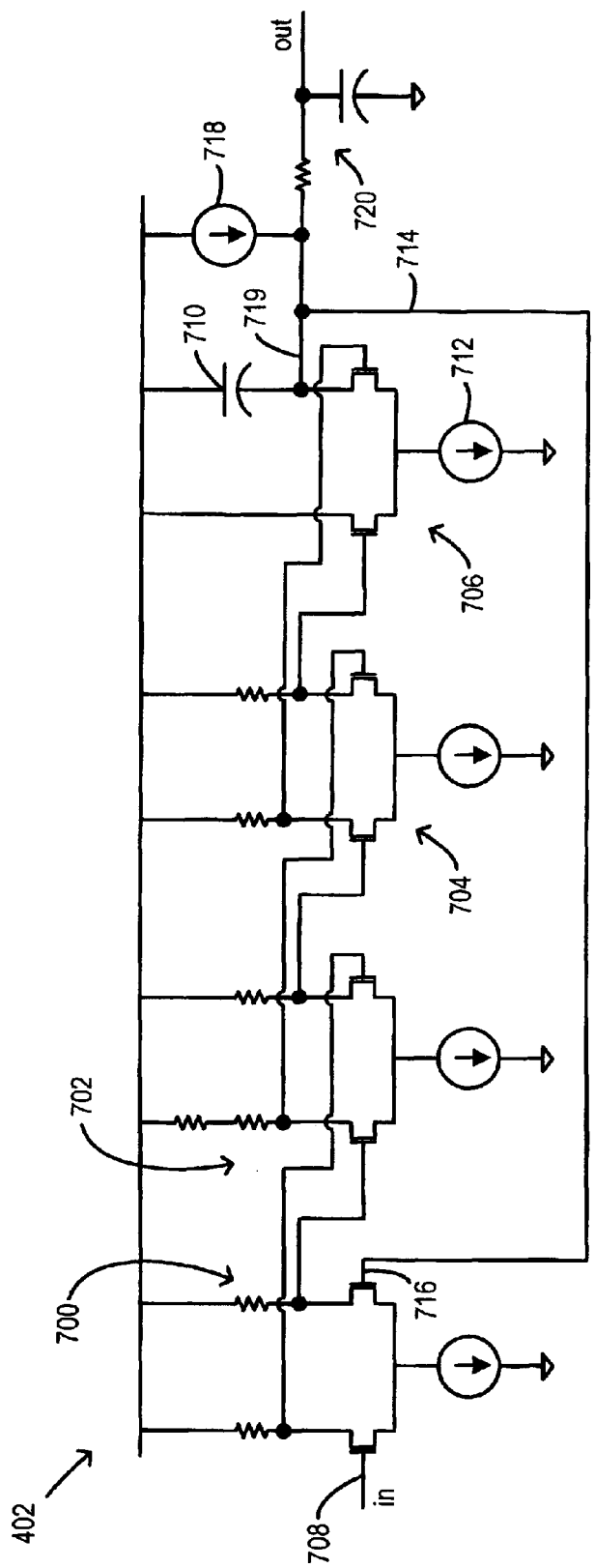
FIG. 7 is a schematic circuit diagram that illustrates a peak detector that is part of the LOS detector of FIG. 4.

FIG. 7 is a schematic circuit diagram that illustrates the peak detector 402 shown in FIG. 4, as provided using CMOS technology according to some embodiments.

As shown in FIG. 7, the peak detector 402 includes four stages: (1) a first balanced differential pair 700, (2) an unbalanced differential pair 702 coupled to the first balanced differential pair 700, (3) a second balanced differential pair 704 coupled to the unbalanced differential pair 702, and (4) a final stage differential pair 706 coupled to the second balanced differential pair 704. An input 708 of the first balanced differential pair is coupled to the input amplifier 400 (FIG. 4) to receive the amplified input signal from the input amplifier.

In the peak detector 402, as an alternative, the second differential pair may be balanced and the third differential pair may be unbalanced. However, having the second stage unbalanced, as illustrated in FIG. 7, may result in higher gain and greater bandwidth for the peak detector 402.

A capacitor 710 is coupled to the drain of the right branch of the final stage differential pair 706. The capacitor 710 may be implemented as a CMOS capacitor (e.g., PMOS with source, drain and bulk) connected to the power supply, as is a known technique of digital CMOS technology. The capacitor 710 may alternatively be implemented as an MIM (Metal Insulator Metal) capacitor.

A current source 712 is associated with the final stage differential pair 706 to charge the capacitor 710 when an input signal is present at the LOS detector 204. A feedback connection 714 couples the output 719 of the final stage differential pair 706 to a second input 716 of the first balanced differential pair 700. A current source 718 is connected between the power supply and the output of the final stage differential pair 706. The output 719 of the final stage differential pair 706 is coupled to the input 422 of the comparator 420 (FIG. 4) via an RC lowpass filter 720 (FIG. 7).

The first and second balanced differential pairs 700, 704 provide the gain required for the peak detector 402. Instead of the two gain stages shown, more or fewer gain stages may be provided. Because of the feedback connection 714 from the output of the final stage differential pair 706 to the first balanced differential pair 700, the total gain of the peak detector 402 is unity.

The unbalanced stage 702 is provided to block current from the current source 712 once the peak of the input signal has been detected at the output of the peak detector 402. At that time, the current source 712 will be bypassed to the left branch of the final stage 706 and consequently will not charge or discharge the capacitor 710. When an input signal is present at the input of the peak detector 402 and the voltage at the output of the final stage differential pair 706 is larger than the negative peak of the input signal, the capacitor 710 is charged by the current source 712 and discharged by the current source 718. Therefore, the magnitude of the current source 712 determines the rate of charging of the capacitor 710 and the magnitude of the current source 718 determines the rate of discharging the capacitor 710. The capacitor 710 will only be charged by the current source 712 if the signal level at the output of the final stage differential pair 706 is greater than the negative peak of the signal present at the input of the peak detector 402, and the signal at the input of the peak detector 402 is less than the DC level at the output of the peak detector 402.

The RC filter 720 is provided at the output of the final stage differential pair 706 to extract the DC component at the output 719 of the final stage 706. Charging or discharging is always occurring at the output of the final stage differential pair 706, so the RC filter is provided to block high frequency signal components.

Figure 8:
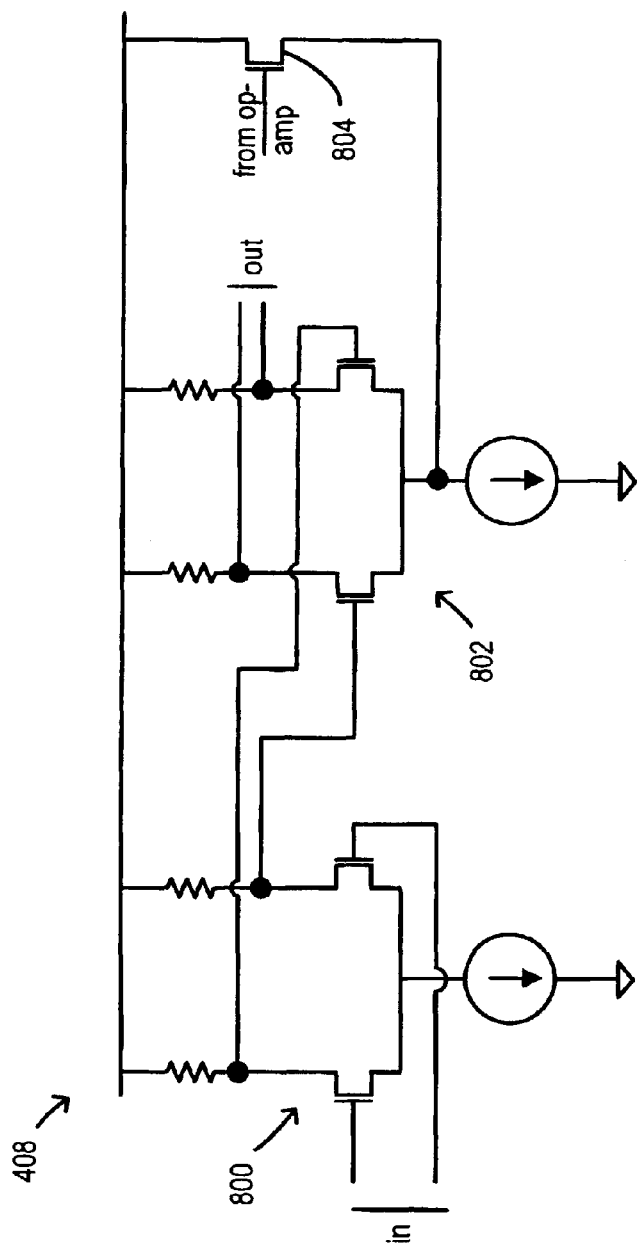
FIG. 8 is a schematic circuit diagram that illustrates a threshold amplifier that is part of the LOS detector of FIG. 4.

FIG. 8 is a schematic circuit diagram that illustrates the threshold amplifier 408 that is part of the LOS detector 204. The threshold amplifier 408 includes an input stage 800 and an output stage 802 that is coupled to the input stage 800. The threshold amplifier also includes a transistor 804 which is coupled between the power supply and the tail of the output stage 802 with the gate of the transistor 804 being coupled to the output 444 of the operational amplifier 434 (FIG. 4).

Design of a suitable threshold generator 406 (FIG. 5) is easily within the abilities of those of ordinary skill in the art, and therefore need not be described herein. The comparator 420 may, in some embodiments, be constituted by a second operational amplifier (not separately shown), or by a single-stage differential amplifier with a current mirror active load.

In operation, the optical input signal received via the optical fiber 102 (FIGS. 1, 2) is converted to an electrical input signal by the photodiode 200 (FIG. 2). The input electrical signal is amplified by the receive amplifier 202, and the resulting amplified signal is supplied to the serializer/deserializer 104 (FIG. 1). The serializer/deserializer 104 converts the input signal to a parallel format and the parallel input signal is provided to the host device 106.

Meanwhile, the input electrical signal from the photodiode 200 is also supplied to the LOS detector 204 (FIG. 2) and more particularly to the input amplifier 400 (FIG. 4). The input amplifier 400 outputs an amplified input signal to the peak detector 402, which detects a peak level of the amplified input signal and supplies the detected peak level to the comparator 420. At the same time, a threshold signal generated by the threshold generator 406 is amplified by the threshold amplifier 408 and the resulting amplified threshold signal is supplied to the comparator 420. The comparator 420 compares the amplified input signal peak level provided from the peak detector 402 to the amplified threshold signal provided from the threshold amplifier 408. On the basis of the comparison, the comparator 420 outputs an LOS signal when the amplified input signal peak level is such as to indicate that the input signal has been lost. The resulting LOS signal may be received by control logic which is not shown. The control logic may initiate a system reinitialization or debugging procedure or take other steps as appropriate in response to the detected loss of input signal.

The provision of the threshold amplifier 408, with a gain that tracks the gain (and any variations therein) of the input amplifier 400, results in automatic compensation for variations in gain of the input amplifier. Consequently, it is not necessary to provide an off-chip compensation arrangement such as a variable resistor that is customarily associated with a prior art LOS detector.

The LOS detector described above, with the gain of the input amplifier compensated by the threshold amplifier, is suitable for use in a wide variety of semiconductor fabrication technology. The LOS detector may be particularly suitable for implementation with CMOS technology. Also, the LOS detector described above may be incorporated in other devices in addition to optical transceivers. Such other devices may include limiting amplifiers and transimpedance amplifiers. The LOS detector described above may be provided on a separate chip or on the same chip with at least some of the circuitry of the transceiver, limiting amplifier, transimpedance amplifier or other device with which the LOS detector is associated.

In some embodiments, some or all of the threshold branch 418 of the LOS detector 204 may be shared among a number of different input channels. The input signal peak detected by the peak detector may be a positive or negative peak. The input signal monitored by the LOS detector may be obtained from a device other than a photodiode.

In some embodiments the input amplifier 400 may not be dedicated to the LOS detector 204, but rather may be shared with the TIA 203 or the LIA 205. For example, the input amplifier 400 could be an initial, intermediate or final stage or stages of the TIA 203 or of the LIA 205, and the threshold amplifier 408 could be arranged to match the gain of such initial, intermediate or final stage or stages.

The LOS detector disclosed herein may be implemented by using bipolar, CMOS or BiCMOS technology, for example. To provide only one possible example, in some embodiments the input amplifier 400, the threshold amplifier 408 and the peak detector 402 may be formed of bipolar devices for fast response, while the operational amplifier 434, the threshold generator 406, and the comparator 420 may be formed of CMOS devices.

The presence of the threshold amplifier 408 in the LOS detector 204 allows for compensation for variations in the gain of the input amplifier 400. In addition, the arrangement of the LOS detector 204 tends to minimize the effect of offsets.

The operational amplifier functions to cause offsets in the input branch 404 of the LOS detector 204 also to be present in the threshold branch 418, so that such offsets are cancelled at the comparator 420. Further, the components of the threshold branch 418 itself are configured to minimize the offsets of those components. Since the signal is already amplified by the input amplifier 400, the effect of the offset is reduced. This in turn allows the offset requirement of the peak detector 402 to be relaxed.

Cancellation of the input branch offsets will now be briefly described.

The DC portion of the signal at node 448 (which corresponds to the output 440 of the input amplifier 400) may be expressed as:

$$V_1 = (A * V_{in\_offset}) + V_{DC},$$

where A is the gain of the input amplifier 400, $V_{in\_offset}$ is the input referred offset of the input amplifier 400, and $V_{DC}$ is the DC component of the signal at node 448 other than the amplified offset.

The DC level $V_1$ is applied to input 436 of the operational amplifier 434 via the lowpass filter 438. Since the other input 442 of the operational amplifier 434 is coupled to center node 432 (between resistors 428, 430 at the outputs of the threshold amplifier 408), the level at node 432 is forced to be substantially $V_1$.

The signal level $V_2$ at the output 414 of the threshold amplifier 408 can be expressed as:

$$V_2 = ((\tfrac{1}{2}) * A * (V_{TH} + V_{TH\_offset})) + V_1,$$

where A is the gain of the threshold amplifier 408 (being substantially the same as the gain of the input amplifier 400), $V_{TH}$ is the threshold level output from the threshold generator 406, and $V_{TH\_offset}$ is the offset of the threshold amplifier 408 (it is assumed that the values of resistors 428 and 430 are substantially equal). The resistors 428 and 430 have rather large values so that the resistors 428, 430 do not affect the gain of the threshold amplifier 408 and so that the node 432 represents the common mode voltage of the outputs 414, 416 of the threshold amplifier 432.

$V_{TH\_offset}$ can be minimized by increasing the size of the devices which make up the threshold generator 406 and the threshold amplifier 408. Consequently, the signal provided to the comparator 420 from the threshold branch 418 of the LOS detector 204 is substantially equal to:

$$((\tfrac{1}{2}) * A * V_{TH}) + V_1$$

The signal provided to the comparator 420 from the input branch 404 of the LOS detector 204 is substantially the peak of the RF component of the amplified input signal plus $V_1$. Thus $V_1$ is cancelled at the comparator 420, which compares the peak of the RF component of the amplified input signal with one-half of the amplified threshold signal.

The offset of the threshold generator 406 and the threshold amplifier 408 are minimized by increasing the size of the components of the threshold generator and the threshold amplifier. As noted above, the threshold amplifier 408 is also configured to track the gain of the input amplifier 400.

For each stage of the input and threshold amplifiers, the gain of the stage is the product of the transconductance $g_m$ and the load resistance R. The transconductance $g_m$ is proportional to the square root of (I*(W/L)), where I is the current, W is the gate width, and L is the gate length.

Let $R_{in}$ be the load resistance for a stage of the input amplifier 400, $I_{in}$ be the current for the stage, and $W_{in}$ and $L_{in}$ the width and length, respectively, of the transistors of the stage. Then, for the corresponding stage of the threshold amplifier 408, the current is reduced to $I_{in}/M$, the load resistance is increased to $M*R_{in}$, so that the voltage swing is maintained the same, the gate width is $(N/M)*W_{in}$ and the gate length is $N*L_{in}$. In these expressions, M is the current ratio, and N is the size scaling factor. For example, N could be around 17, to produce substantially an increase in size (area) of about a factor of about 300. (Alternatively, the gate width for the corresponding threshold amplifier stage could be $N*W_{in}$ and the gate length could be $N*M*L_{in}$.) The current ratio M may be chosen such that the current consumption is low enough to satisfy device specifications while achieving gain tracking. For example, M may be in the range 2–10 depending of the specified accuracy of the threshold.

With this scaling in size of the threshold amplifier gain stages, the offset is minimized, while the gate configuration is such that the gain of the threshold amplifier stage tracks the gain of the corresponding stage of the input amplifier.

Thus, in some embodiments, an input branch of an LOS detector is coupled to a first input of a comparator and a threshold branch of the LOS detector is coupled to a second input of a comparator. An operational amplifier is connected between the input branch and the threshold branch to couple an offset level from the input branch to the threshold branch. The offset level is then cancelled at the comparator. In this way the precision of the LOS detector may be improved.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   a comparator;
   an input branch coupled to a first input of the comparator;
   a threshold branch coupled to a second input of the comparator; and
   an operational amplifier connected between the input branch and the threshold branch to couple an offset level from the input branch to the threshold branch;
   wherein:
   the input branch is capable of receiving an input signal and providing to the first input of the comparator a signal that is representative of the input signal; and
   the threshold branch is capable of providing an amplified threshold signal to the second input of the comparator.

2. The apparatus of claim 1, wherein the input branch includes:
   an input amplifier capable of receiving the input signal and outputting an amplified input signal; and
   a peak detector connected between an output of the input amplifier and the first input of the comparator;
   and the threshold branch includes:
   a threshold generator; and
   a threshold amplifier connected between the threshold generator and the second input of the comparator.

3. The apparatus of claim 2, wherein:
   a first input of the operational amplifier is coupled to an output of the input amplifier via a low pass filter;
   a voltage divider is connected between outputs of the threshold amplifier, a second input of the operational amplifier being coupled to a center node of the voltage divider; and
   an output of the operational amplifier is coupled to an input of the threshold amplifier.

4. The apparatus of claim 2, wherein the peak detector includes:
   a first balanced differential pair;
   an unbalanced differential pair coupled to the first balanced differential pair;
   a second balanced differential pair coupled to the unbalanced differential pair;
   a final stage differential pair coupled to the second balanced differential pair; and
   a capacitor coupled to the final stage differential pair.

5. The apparatus of claim 2, wherein the input amplifier and the threshold amplifier are both formed on the same semiconductor die, the threshold amplifier being configured to substantially match a gain of the input amplifier.

6. The apparatus of claim 1, wherein at least one of the comparator, the input branch, the threshold branch and the operational amplifier includes at least one CMOS field effect transistor.

7. An apparatus comprising:
   a comparator;
   an input branch coupled to a first input of the comparator;
   a threshold branch coupled to a second input of the comparator; and
   an operational amplifier connected between the input branch and the threshold branch to couple an offset level from the input branch to the threshold branch;
   wherein the comparator includes a second operational amplifier.

8. An apparatus comprising:
   a photodiode capable of being coupled to an optical fiber to receive an optical input signal and to generate an electrical input signal;
   a receive amplifier coupled to the photodiode;
   a host device coupled to the receive amplifier; and
   a loss-of-signal detector coupled to the photodiode;
   wherein the loss-of-signal detector includes:
   a comparator;
   an input branch coupled to a first input of the comparator;
   a threshold branch coupled to a second input of the comparator; and
   an operational amplifier connected between the input branch and the threshold branch to couple an offset level from the input branch to the threshold branch;
   wherein the input branch is coupled to the photodiode to receive an electrical input signal from the photodiode; and
   wherein the input branch includes:
   an input amplifier capable of receiving the electrical input signal and outputting an amplified input signal; and a peak detector connected between an output of the input amplifier and the first input of the comparator;

and the threshold branch includes:

a threshold generator; and a threshold amplifier connected between the threshold generator and the second input of the comparator.

9. The apparatus of claim 8, wherein:

a first input of the operational amplifier is coupled to an output of the input amplifier via a low pass filter;

a voltage divider is connected between outputs of the threshold amplifier, a second input of the operational amplifier being coupled to a center node of the voltage divider; and an output of the operational amplifier is coupled to an input of the threshold amplifier.

10. The apparatus of claim 8, wherein the peak detector includes:

a first balanced differential pair;

an unbalanced differential pair coupled to the first balanced differential pair;

a second balanced differential pair coupled to the unbalanced differential pair;

a final stage differential pair coupled to the second balanced differential pair; and a capacitor coupled to the final stage differential pair.

11. The apparatus of claim 8, wherein the input amplifier and the threshold amplifier are both formed on the same semiconductor die, the threshold amplifier being configured to substantially match a gain of the input amplifier.

12. The apparatus of claim 8, wherein at least one of the comparator, the input branch, the threshold branch and the operational amplifier includes at least one CMOS field effect transistor.

13. An apparatus comprising:

a photodiode capable of being coupled to an optical fiber to receive an optical input signal and to generate an electrical input signal;

a receive amplifier coupled to the photodiode;

a host device coupled to the receive amplifier; and a loss-of-signal detector coupled to the photodiode;

wherein the loss-of-signal detector includes:

a comparator;

an input branch coupled to a first input of the comparator;

a threshold branch coupled to a second input of the comparator; and an operational amplifier connected between the input branch and the threshold branch to couple an offset level from the input branch to the threshold branch;

wherein the input branch is coupled to the photodiode to receive an electrical input signal from the photodiode; and wherein the comparator includes a second operational amplifier.

14. An apparatus comprising:

a comparator;

an input branch coupled to a first input of the comparator;

a threshold branch coupled to a second input of the comparator; and means for coupling an offset level from the input branch to the threshold branch;

wherein:

the input branch is capable of receiving an input signal and providing to the first input of the comparator a signal that is representative of the input signal; and the threshold branch is capable of providing an amplified threshold signal to the second input of the comparator.

15. The apparatus of claim 14, wherein the means for coupling includes an operational amplifier having a first input coupled to the input branch and a second input coupled to the threshold branch.

16. The apparatus of claim 15, wherein:

the threshold branch includes a threshold amplifier; and the operational amplifier has an output coupled to an input of the threshold amplifier.

17. An apparatus comprising:

an input amplifier capable of receiving an input signal and outputting an amplified input signal;

a peak detector coupled to the input amplifier to receive the amplified input signal and capable of outputting a first signal that represents a peak level of the amplified input signal;

a threshold generator capable of generating a threshold signal;

a threshold amplifier coupled to the threshold generator to receive the threshold signal and capable of outputting an amplified threshold signal;

a comparator coupled to the peak detector and to the threshold amplifier and capable of comparing the first signal to the amplified threshold signal; and an operational amplifier having a first input coupled to an output of the input amplifier, a second input coupled to an output of the threshold amplifier, and an output coupled to an input of the threshold amplifier.

18. The apparatus of claim 17, wherein the first input of the operational amplifier is coupled to the output of the input amplifier via a lowpass filter.

19. The apparatus of claim 17, wherein the threshold amplifier has three inputs including: (a) the input coupled to the output of the operational amplifier, and (b) a pair of inputs coupled to the threshold generator.

20. An apparatus comprising:

an input amplifier capable of receiving an input signal and outputting an amplified input signal;

a peak detector coupled to the input amplifier to receive the amplified input signal and capable of outputting a first signal that represents a peak level of the amplified input signal;

a threshold generator capable of generating a threshold signal;

a threshold amplifier coupled to the threshold generator to receive the threshold signal and capable of outputting an amplified threshold signal;

a comparator coupled to the peak detector and to the threshold amplifier and capable of comparing the first signal to the amplified threshold signal;

a voltage divider connected between outputs of the threshold amplifier and having a center node; and an operational amplifier having a first input coupled to an output of the input amplifier, a second input coupled to the center node of the voltage divider, and an output coupled to an input of the threshold amplifier.

21. The apparatus of claim 20, wherein the first input of the operational amplifier is coupled to the output of the input amplifier via a lowpass filter.

22. The apparatus of claim 20, wherein the threshold amplifier has three inputs including: (a) the input coupled to the output of the operational amplifier, and (b) a pair of inputs coupled to the threshold generator.

23. A method comprising:

receiving an input signal;

amplifying the input signal with a first amplifier to provide an amplified input signal;

detecting a peak of the amplified input signal to provide a first signal that represents a peak level of the amplified input signal;

generating a threshold signal;

amplifying the threshold signal with a second amplifier to provide an amplified threshold signal;

coupling an amplified offset level from an output of the first amplifier to an output of the second amplifier; and comparing the first signal to the amplified threshold signal.

24. The method of claim 23, further comprising:

detecting an interruption of the input signal on the basis of a result of comparing the first signal to the amplified threshold signal.

25. The method of claim 23, further comprising:

amplifying the input signal with a third amplifier.

26. The method of claim 25, further comprising:

supplying a signal from the third amplifier to a host device.

* * * * *